United States Patent
Beaulaton et al.

(10) Patent No.: US 7,385,451 B2
(45) Date of Patent: Jun. 10, 2008

(54) ARRANGEMENT, PHASE LOCKED LOOP AND METHOD FOR NOISE SHAPING IN A PHASE-LOCKED LOOP

(75) Inventors: Hugues Beaulaton, Toulouse (FR);
Philippe Gorisse, Toulouse (FR);
Nadim Khlat, Toulouse (FR)

(73) Assignee: Freescale Semiconductor, Inc., Austin, TX (US)

( * ) Notice: Subject to any disclaimer, the term of this patent is extended or adjusted under 35 U.S.C. 154(b) by 9 days.

(21) Appl. No.: 10/537,634

(22) PCT Filed: Nov. 27, 2003

(86) PCT No.: PCT/EP03/50905
§ 371 (c)(1),
(2), (4) Date: Apr. 10, 2006

(87) PCT Pub. No.: WO2004/051855
PCT Pub. Date: Jun. 17, 2004

(65) Prior Publication Data
US 2006/0192620 A1    Aug. 31, 2006

(30) Foreign Application Priority Data
Dec. 3, 2002    (EP) .................................. 02292978

(51) Int. Cl.
*H03L 7/00*    (2006.01)
(52) U.S. Cl. ....................... 331/16; 331/177 R; 331/34; 331/1 A; 377/47

(58) Field of Classification Search .................. 331/16, 331/34, 177 R, 1 A; 377/47
See application file for complete search history.

(56) References Cited

U.S. PATENT DOCUMENTS
6,069,535 A    5/2000   Khlat
2002/0160730 A1   10/2002  Nozahic et al.

FOREIGN PATENT DOCUMENTS
WO    WO 00/69074 A    11/2000

OTHER PUBLICATIONS
Miller et al; "A Multiple Modulator Fractional Divider"; 44th Annual IEEE Symposium on Frequency Control, 1999, pp. 559-568.

*Primary Examiner*—Arnold Kinkead

(57) ABSTRACT

A noise shaping arrangement for a phase locked loop includes a first order sigma-delta modulator arranged to provide a first-order quantized output and a feedback path output. A second order sigma-delta modulator is arranged to receive the feedback path output and provides a second order quantized output. A combination block combines the first and second order quantized outputs to provide a combined third order quantized output, which provides noise shaping with a frequency notch spectrum. In this way a new quantization noise shape of third order is provided, such that quantization phase noise may be lowered, the PLL loop bandwidth may be increased, modulation phase error may be reduced and PLL locking speed increased.

16 Claims, 4 Drawing Sheets

ARRANGEMENT, PHASE LOCKED LOOP AND METHOD FOR NOISE SHAPING IN A PHASE-LOCKED LOOP

FIELD OF THE INVENTION

This invention relates to fractional-n frequency synthesizer systems that employ Phase-Locked-Loops (PLLs).

BACKGROUND OF THE INVENTION

In the field of this invention it is known that a fractional-N PLL implemented for GSM (Global System for Mobile telecommunications) standards employs a sigma-delta modulator such as the Multi Accumulators noise Shaping (MASH) II or MASH III architecture. These systems were first described in the IEEE paper: "A multiple modulator fractional divider", May 1990 by B. Miller and B. Conley. Such systems provide a corrected quantization noise spectrum shape for a synthesised non-modulated frequency.

Modern radios use fractional-N PLLs to synthesize the carrier frequency of the radio, as shown in the circuit of FIG. 1. A reference signal is synthesized from a stable and known reference frequency 10. This is fed to a voltage controlled oscillator (VCO) 40 via a phase-frequency detector (PFD) 20 and a loop filter 30. The VCO 40 outputs a carrier signal according to its tuning voltage. Control of the tuning voltage is achieved by a feedback loop which provides a feedback signal to the PFD 20 via a multi modulus divider (MMD) 50, which in turn is controlled by a digital sigma-delta modulator 60 coupled to receive a digital number 70 indicating the frequency location of a carrier.

The PFD 20 compares the phases between the reference frequency 10 and the feedback signal, which is the output of the VCO 40 after being divided. Finally, the loop filter 30 (a low-pass filter) smoothes the output of the PFD 20 and provides it to the VCO 40. In locked conditions, both inputs to the PFD 20 have the same frequency and phase.

Therefore, the frequency synthesized is a multiple of the reference frequency 10, controlled by the digital sigma-delta modulator 60 that drives the MMD 50. The loop dynamic, principally defined by the loop filter 30, has the ability to average the division ratio. Therefore if the MMD 50 is modulated fast enough by the digital sigma-delta modulator 60, the frequency synthesized is a fractional multiple of the reference frequency 10.

There are a wide range of techniques that modulate the MMD 50 to provide the desired average division ratio. The main drawback of these known techniques is the quantization noise injected into the loop. Much effort has been expended to provide arrangements which reduce the amount of noise added and several solutions have been proposed using sigma-delta modulators which attempt to overcome this major problem.

Such arrangements perform noise shaping in the form of a high pass characteristic that is removed from the low-pass loop filter 30. The MASH III structure is popularly used due to its ability to generate shaped quantization noise.

A problem with this known arrangement is that removing the quantization noise implies constraints on the loop filter bandwidth that reduce the loop lock time and enlarges the modulation phase error when performed through the modulator.

Furthermore, implemented in a frequency synthesizer for GSM standards, this limitation degrades the direct modulation phase error and reduces the PLL lock time. A further known arrangement, the MASH IV structure, can mathematically reach the desired performance criteria, but provides an output range twice that of the MASH III structure. Therefore, the loop non-linearity is exercised twice and degrades performance by increasing the overall phase noise.

A need therefore exists for a fractional-n PLL frequency synthesizer wherein the abovementioned disadvantage(s) may be alleviated.

STATEMENT OF INVENTION

In accordance with a first aspect of the present invention there is provided an arrangement as claimed in claim 1.

In accordance with a second aspect of the present invention there is provided a phase locked loop as claimed in claim 13.

In accordance with a third aspect of the present invention, there is provided a method as claimed in claim 14.

Preferably the second order sigma-delta modulator is arranged with one or more complex conjugate pairs of zeros. The frequency location of the one or more complex pair of zeros is preferably a selected one of substantially 365 kHz and substantially 518 kHz.

The feedback path output of the first order sigma-delta modulator received by the second order sigma-delta modulator is preferably scaled by a factor of substantially one quarter and preferably accumulators of the first order and second order sigma-delta modulator respectively have the same bit-size.

Preferably the arrangement further comprises a delay block coupled between the output of the first order sigma-delta modulator and the combination means.

The combination means preferably includes scaling means coupled to scale the second order quantized output of the second order sigma-delta modulator by a predetermined scaling factor. Preferably the predetermined scaling factor is substantially $2^{-22}$.

Preferably the phase locked loop is a fractional-n phase locked loop frequency synthesizer.

In this way an arrangement, phase locked loop and method for noise shaping in a phase locked loop are provided, such that quantization phase noise may be lowered, the PLL loop bandwidth may be increased, modulation phase error may be reduced and PLL locking speed increased.

BRIEF DESCRIPTION OF THE DRAWINGS

One an arrangement, phase locked loop and method for noise shaping in a phase locked loop incorporating the present invention will now be described, by way of example only, with reference to the accompanying drawings, in which.

DESCRIPTION OF PREFERRED EMBODIMENT(S)

Figure 1:
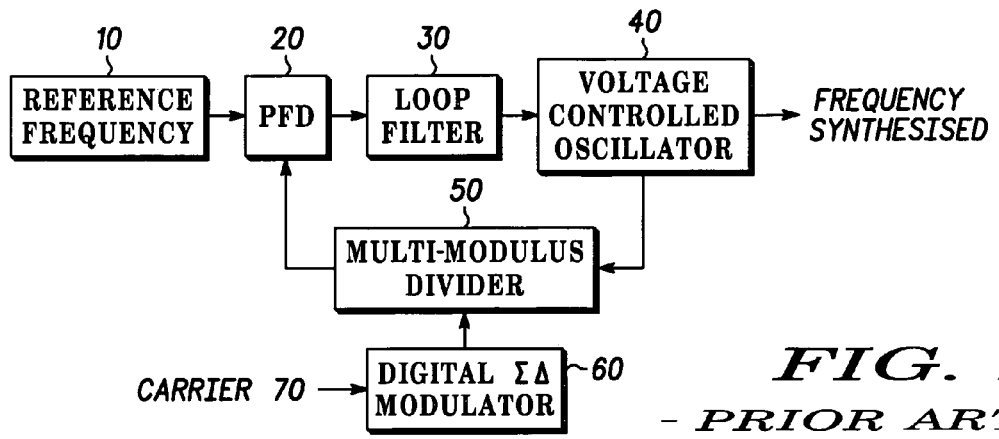
FIG. 1 is a block schematic diagram illustrating a Fractional-N phase locked loop synthesizer.
Figure 2:
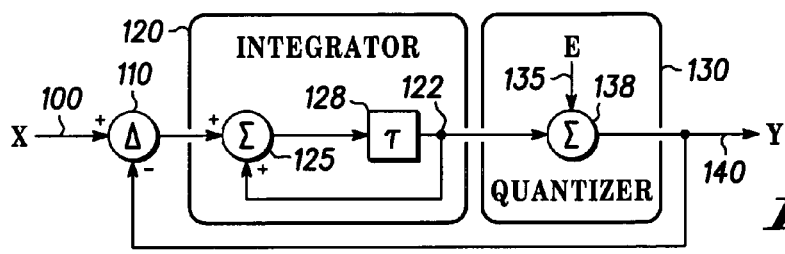
FIG. 2 is a block schematic diagram illustrating mathematically the performance of a first order sigma-delta modulator.

Referring to FIG. 2, there is shown a block diagram illustrating the mathematical behaviour of a sigma-delta modulator of first order, derived from an integrator 120 followed by a one-bit quantizer 130.

The integrator 120 sums an input value X (100) by its previous one, via delay block 128 and summation block 125. The signal at node 122 is a ramp that has a slope proportional to the input value X (100). The quantizer 130 provides a quantized output Y (140). When the integrator reaches the quantization threshold at block 138, the quantized value is removed from the integrator input by block 110. The quantization noise is the difference between the sigma-delta output and the integrator input. It is therefore symbolized by an injection of quantization noise E (135). The following time domain equation is derived from FIG. 2:

$$Y(t) = X \cdot (t - \tau) + \frac{dE(t)}{dt} \quad (1)$$

Therefore the system response is the delayed input added with the derivative of its quantized noise.

Figure 3:
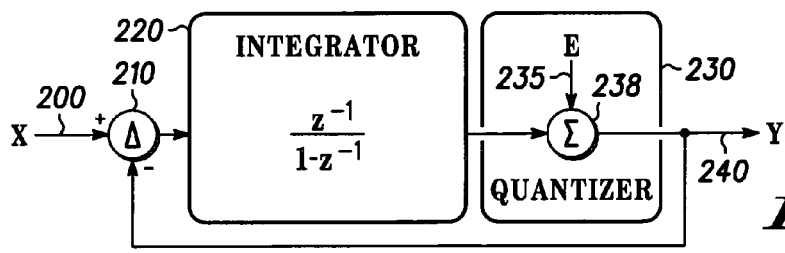
FIG. 3 is a block schematic diagram illustrating mathematically a z-transform of a first order sigma-delta modulator.

Referring now also to FIG. 3, there is shown a block schematic diagram showing the z-transform domain of the frequency response of this first order system. An input signal X (200) is combined with a feedback signal at summation block 210. An integrator 220 and a quantizer 230 then operate on the output of the summation block 210. The quantizer 230 includes quantization noise E (235), and provides an output Y (240).

This gives the frequency domain analysis behaviour equation:

$$Y = X.z^{-1} + E.(1-z^{-1}) \quad (2)$$

Equation 2, simply stated, says that the output Y is the image of the input X (delayed because of the process time) added with the quantization noise multiplied by the factor $(1-z^{-1})$.

This factor is re-written as equation (3) to find its pole and zero location. As can be seen, there is a pole at z=0 and a zero at z=1. In terms of frequency, there is a zero at DC.

$$1 - z^{-1} = 0 \equiv \frac{z-1}{z} = 0 \quad (3)$$

Those positions can be drawn on a unity circle. In this configuration, the quantization noise is pushed away from the DC value.

In many applications not only the total amount of noise but also the frequency distribution of this noise is of importance. For example, in specifications for the Global System for Mobile communications (GSM), a noise mask indicating an acceptable noise level as a function of frequency is prescribed. Hence, in many applications, the total noise energy may be acceptable but the frequency distribution of the noise may be unacceptable. Thus, it may be undesirable to implement a configuration wherein noise is not simply pushed away from the DC value as in the above described first order delta modulator. Rather, a noise shaping in order to meet a given acceptable noise frequency distribution may be advantageous.

In accordance with the described embodiment of the Invention, a third order noise shaper is implemented having a notch frequency response for shaping of the noise. As described in for example "Digital Signal Processing, Principles, Algorithms and Applications" by John G. Proakis and Dimitris G. Monolakis, second edition, Macmillan Publishing Company, 1992, ISBN 0-02-396815-X, page 355, a notch filter is a filter that contains one or more deep notches or, ideally, perfect nulls in its frequency response characteristic.

The third order noise shaper with notched spectrum may locate two zeros as complex conjugate pair such that the remaining output is real.

Furthermore, this would provide a signal that has a mean value corresponding with the input signal X. Consequently, the zeros at DC should remain.

Specifically, as described in the following, the first order sigma-delta modulator is in the preferred embodiment followed by a second order sigma-delta modulator implementing a quantisation noise shaping function having two zeroes located as a complex conjugate pair of zeroes preferably on the unity circle. The second order sigma-delta modulator cancels the quantization noise of the first order sigma delta modulator. The complex conjugate pair of zeroes may be implemented to provide a notch frequency spectrum having notches at desired frequencies whereby a desired noise shaping characteristic may be achieved. Thus, the complex conjugate pair of zeroes may used to rearrange the noise distribution away from the notch frequencies e.g. towards other frequencies, such as towards DC and/or higher frequencies. This may allow or facilitate meeting a specific noise mask requirement for a sigma-delta modulator or phase locked loop.

The following description illustrates how the noise shaping is implemented and the location of the complex conjugate pair of zeroes is determined in accordance with the preferred embodiment.

Figure 4:
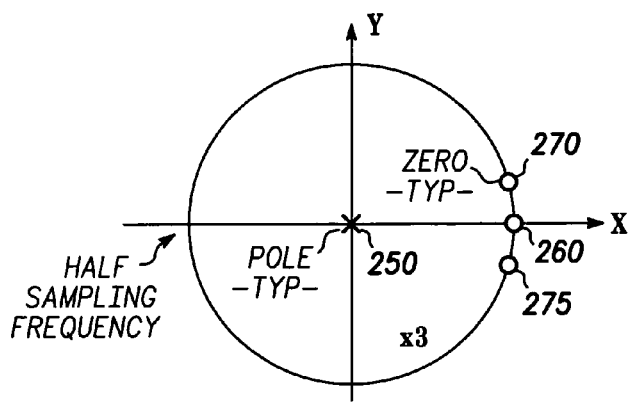
FIG. 4 is a graphical diagram illustrating pole and zero positions.

Referring now also to FIG. 4 there is shown a unity circle demonstrating a configuration of the unity poles and zeros for the noise transfer function in accordance with an embodiment of the invention. Three poles 250 are located at the centre of the unity circle. A first zero 260, is located on the circumference of the circle where it intersects the positive real axis, and is therefore entirely real. Second and third zeros 270 and 275 respectively form a complex conjugate pair either side of the first zero 260, such that the overall output remains real. The position of the zeroes determines the noise frequency distribution and thus noise shaping may be achieved through the introduction and situating of the zeroes.

Figure 5:
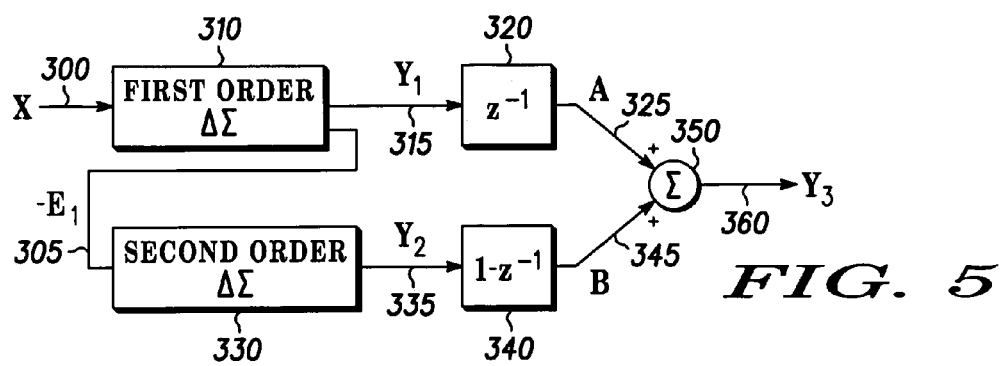
FIG. 5 is a block schematic diagram illustrating a third order noise shaper with spectral notch.

In order to provide the poles and zeros plotted in FIG. 4, a noise shaper is realized with a single first order sigma-delta modulator cascaded with a second order modulator having a conjugate pair of zeros in such way that the quantization noise of the first module is cancelled by the second module. Referring now to FIG. 5 there is shown a noise shaper which performs this function. An input signal X (300) is provided to a first order sigma-delta modulator 310. A second order sigma-delta modulator 330 is coupled to the first order sigma-delta modulator 310 and receives an output signal 305 therefrom, which contains phase noise $E_1$. The first order sigma-delta modulator 310 is further coupled to provide an output $Y_1$ (315) to block 320. Block 320 provides an output A (325) to a summation block 350.

Similarly the second order sigma-delta modulator 320 is coupled to provide an output $Y_2$ (335) to block 340. Block 340 provides an output B (345) to the summation block 350. The summation block then combines output A (325) with output B (345) to derive output $Y_3$ (360).

In this way the module of first order is delayed by one sampling period and the output of the second order module is derived once. The transfer function of FIG. 5 will be more fully described below.

The frequency domain behaviour is derived from the z-like equation of a second order sigma-delta modulator having a conjugate pair of zeros.

$$Y = X.z^{-1} + E.(z - re^{i\theta}).(z + re^{-i\theta}).z^{-2} \quad (4)$$

where r and θ are the vector magnitude and angle of both zeros respectively.

From the trigonometric rules, the following relationship arises:

$$Y = X.z^{-1} + E.(z^2 - 2rz.\cos\theta + r^2).z^{-2} \quad (5)$$

The couple of zeros have to be on the unity circle in order to not scale the generated signal. Thus, r=1 and equation (5) can be re-written as $$Y = X.z^{-1} + E.(z^2 - 2z.\cos\theta + 1).z^{-2} \quad (6)$$

A real system cannot lead a signal but only lag it; that is why E has been factorized by $z^{-2}$; consequently equation (6) becomes $$Y = X.z^{-1} + E.(1 - 2z^{-1}.\cos\theta + z^{-2}) \quad (7)$$

With the notch position defined by θ, which is given by $$\theta = 2\pi \frac{f}{f_s} \quad (8)$$

where $f_s$ is the sampling frequency.

The notch frequency may be selected as desired to meet a given noise shape or frequency distribution. For example, the notch frequency may be situated at a frequency where a given noise requirement or mask is otherwise exceeded.

Figure 6:
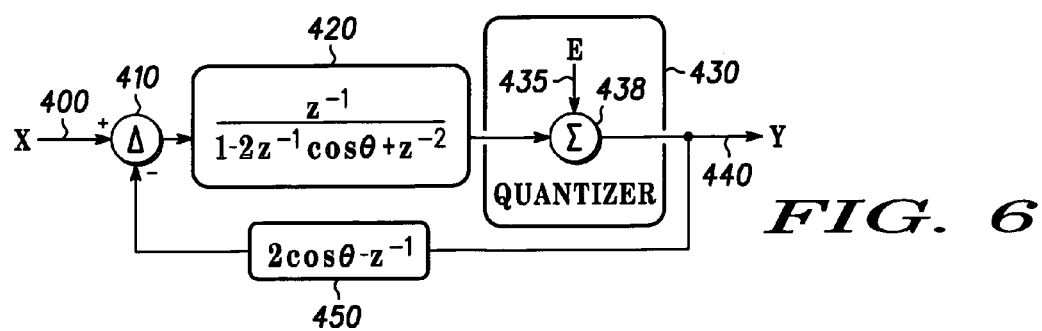
FIG. 6 is a block schematic diagram illustrating a second order sigma-delta with notched spectrum.

From equation 7, the schematic of the second order modulator may be plotted. Referring now also to FIG. 6, there is shown such a schematic. An input signal X (400) is fed to a summation block 410. A first time-domain function block 420 represents the modulator function to be performed on the input signal X (400). The quantizer 430 is coupled to receive an output from the first function block 420, and provides an output Y (440). A second function block 450 provides a feedback function, the results of which are fed back via the summation block 410. Thus, the second order modulator of FIG. 6 provides for a noise spectrum comprising notch frequencies caused by the two zeroes of the noise transfer function of equation (4).

Referring again to FIG. 5, the overall transfer function is analyzed as follows:

The signal at branch A is derived from (2), $$A = X.z^{-2} + E_1.(z^{-1} - z^{-2}) \quad (9)$$

The signal branch B from (7) where the input of the second module is the quantified noise of the first one, $$B = \{-E_1.z^{-1} + E_2.(1 - 2z^{-1}\cos\theta + z^{-2})\}(1 - z^{-1}) \quad (10)$$

After reduction, $$B = -E_1.(z^{-1} - z^{-2}) + E_2.(1 - 2z^{-1}\cos\theta + z^{-2}).(1 - z^{-1}) \quad (11)$$

The sum of both branches A and B produces $$Y_3 = X.z^{-2} + E_2.(1 - 2z^{-1}\cos\theta + z^{-2}).(1 - z^{-1}) \quad (12)$$

The quantization noise of the first order sigma-delta is cancelled and the remaining one is provided from the second order system having the three zeros as defined in FIG. 4. Thus, by altering position of the zeroes and thus the notch frequencies, different noise shaping can be achieved and specifically noise may be removed from critical frequencies by locating the zeroes such as to create notches at or close to these frequencies.

It will be appreciated that the above design may be easily implemented in a digital circuit in a way that is re-usable and safe. Furthermore, such a circuit has an area and drain current equivalent to those of the MASH III architecture.

A digital implementation must be able to accurately define the system structure with simple functions that can be implemented with a digital library such as delays, adders and gains. The delay functions are performed with flip-flops, the adders with gates and the gains by selecting and connecting appropriate elements of the signal path(s).

Figure 7:
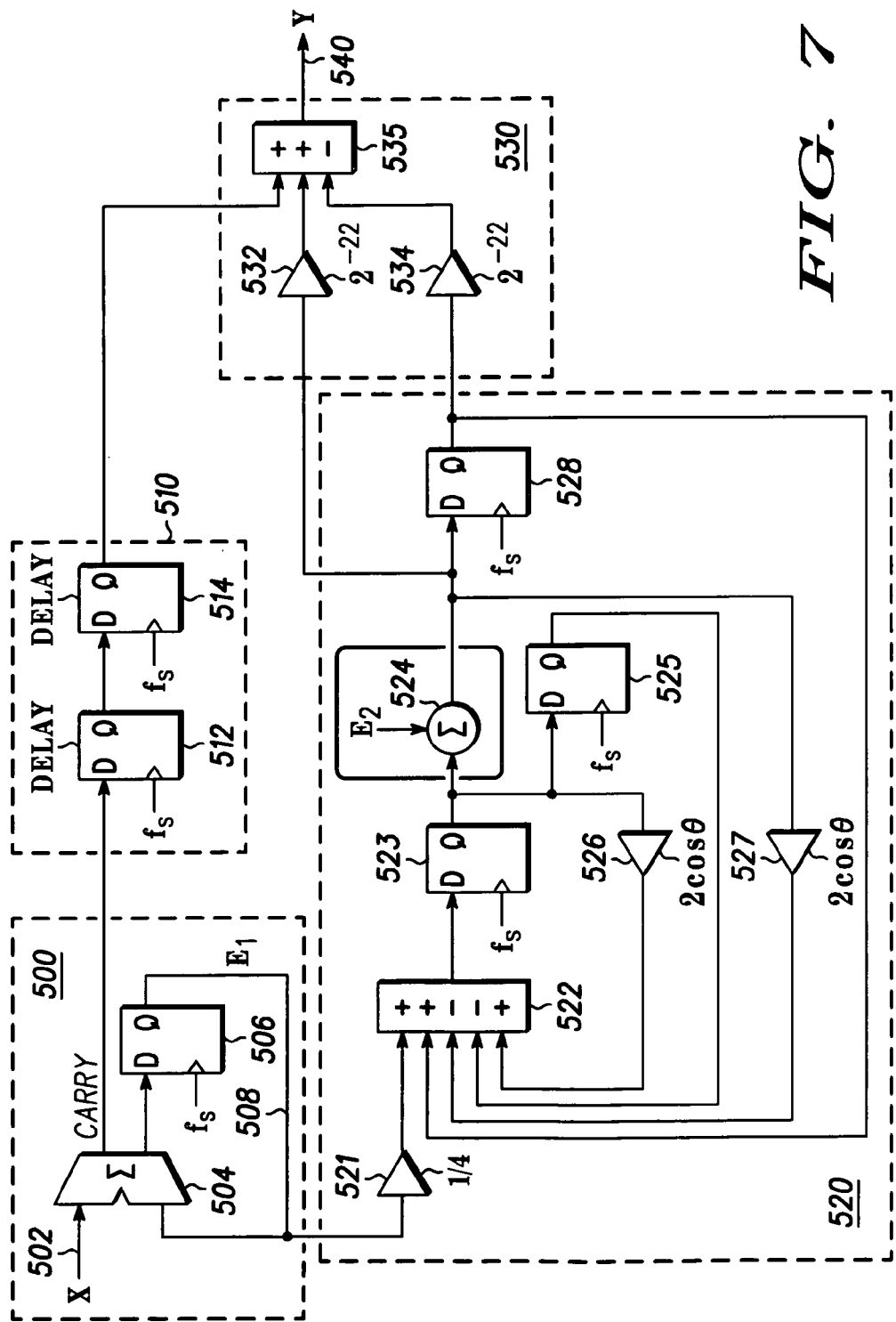
FIG. 7 is a block schematic diagram illustrating detail structure of the third order noise shaper; and, FIG. 8 is a graph showing frequency offset versus phase noise for a prior art arrangement and the arrangement of FIG. 7 respectively.

Referring now to FIG. 7, there is shown a structure derived from the functions described above with respect to FIG. 5, which includes a first order sigma-delta modulator 500, a delay block 510, a second order sigma-delta modulator 520, and a combination block 530.

The first modulator 500 has an accumulator 504 with two outputs: a single 1-bit carry and the sum of both inputs coupled to receive an input signal X (502) and the delayed sum (508). The 1-bit carry performs a 1-bit quantization which is sufficient for the first modulator 500 because it is of first order. The carry generates a stream of 0 or 1 values with the mean value being the input X (502).

In this embodiment, the accumulator 504, is of 24 bit size in order to get an accurate and narrow frequency step, with spurious components spread throughout the frequency band. Hence, the digital unity weight is $2^{24}$. The natural overflow of the accumulators creates the quantizer function of the quantizer 504, and thus no hardware components are required for its implementation. A delay element 506, typically implemented using a flip-flop, provides a delayed feedback signal 508 from the sum output of the quantizer 504 back to its input.

The delay block 510 comprises two delay elements 512 and 514, coupled in series to receive the carry output from the quantizer 504, for providing a delayed first order output signal.

The second order sigma-delta modulator 520 has a second order quantizer 524, which provides an output ranging from −1 to +2. The quantizer 524 is therefore signed and of 2 bits (4 levels), and the overall implementation is also signed. This function is implemented by means of a look-up table. With 24 bit accumulators and 2-bit quantizer, the quantized unity has a weight of $2^{22}$. The weight difference between both modulators creates a mismatch that is corrected by scaling the input to the modulator 520 by a quarter, via scaling block 521. In this way the quantization noise $E_1$ present in feedback path signal 508 is divided by four upon entering the second order modulator 520.

An adder 522 of the second order modulator 520 has inputs which are signed numbers. Therefore, the adder 522 is designed with gates in such way that its output provides no carry and can be normalized on 24 bits.

A first positive input to the adder 522 is coupled to receive the scaled feedback path signal 508 from the first order modulator 500 via the scaling block 521.

The output of the adder 522 is coupled via delay element 523 to the quantizer 524, from which a second order quantized output is derived.

A second positive input to the adder 522 is provided from the second order quantized output of the quantizer 524, delayed via a delay element 528.

A third positive input to the adder 522 is provided from the input to the quantizer 524, via scaling block 526, to be further described below.

A first negative input to the adder 522 is provided from the quantized output of the quantizer 524, via scaling block 527, to be further described below.

A second negative input to the adder 522 is provided from the input to the quantizer 524, via delay element 525.

The combination block 530 performs derivation, scaling and summation of the outputs of the first and second order modulators 500 and 520 respectively. The second order quantized output and the delayed second order quantized output of the second order modulator 520 are scaled by a factor of $2^{-22}$ via scaling blocks 532 and 534 respectively in order to provide the correct range of output values, namely from −3 to +4 for this particular implementation.

The delayed first order output signal (from the delay block 510) is combined with the second order output signal (form the scaling block 532) and the delayed second order output signal (from the scaling block 534) at adder 535, from which a combined output Y (540) is derived.

The scaling blocks 526 and 527 are both arranged to provide a 2.cosθ scaling factor, the effective gain being determined by the desired frequency notch.

For example, a desired frequency around 365 KHz is performed with a 2.cosθ=1.9922, which is equivalent in binary to $(1.1111111)_2$ sampling at a rate of 26 MHz. This function is realized with a single subtraction in verilog.

$$2.\cos\theta = (2 - 2^{-7}) \qquad (19)$$

Furthermore with a GMSK modulation for GSM standards the notch placed at 518 KHz is judicious and easily implemented with a clock at 26 MHz because of the relationship:

$$2.\cos\theta = (2 - 2^{-6}) \qquad (20)$$

In addition, the same look-up table can perform the quantized function and process the second digital gain at the quantizer output.

Figure 8:
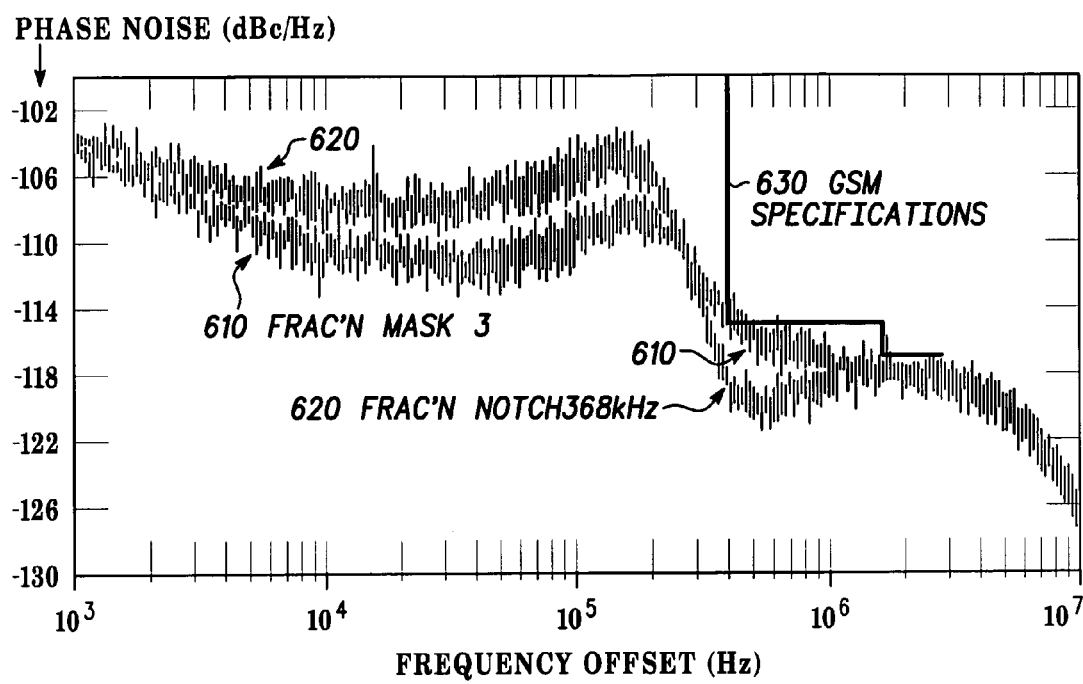

Referring now to FIG. 8 there is shown a graph of frequency offset versus phase noise of a prior art Fractional-N MASH 3 arrangement (line 610) and a Fractional-N 368 kHz notch arrangement according to the above embodiment (line 620).

The line 620 of the graph of FIG. 8 was obtained by measuring the phase-noise generated at a VCO output using a loop filter of third order with a cut-off frequency of 200 kHz, a reference frequency of 26 MHz and a charge-pump and VCO gain of 2 mA and 20 MHz/V respectively, for a synthesised frequency of 940 MHz.

The GSM specifications are shown by line 630. As can be seen, the line 620 remains at a greater distance from the line 630 than the line 610.

Thus, as illustrated in FIG. 8 a noise mask 630 will typically result in some frequencies being more critical than other frequencies. In the example, of FIG. 4 the noise mask requirement at 400 kHz is particularly critical and is only marginally met by the prior art arrangement. However, introducing a notch frequency noise shaping as described, the noise may be selectively reduced at a desired frequency. Thus, in the example the noise density around 400 kHz is substantially reduced at 400 kHz by introducing a zero and corresponding notch frequency at 386 kHz. In the example, this results in increased noise at lower frequencies but this is acceptable as the noise mask is met with a substantial margin at these frequencies. Thus, a noise shaping resulting in increased margin with respect to the required noise mask and thus facilitated production and increased reliability is achieved.

In this way a digital sigma-delta modulator is provided that shapes its quantization noise in a way that better fits the modulation mask specifications.

The present invention therefore allows a new quantization noise shape of third order to be obtained, allowing the loop bandwidth to be increased and the phase noise specifications to be reached. It therefore permits direct modulation to be performed with a lower phase error, and speeds up the PLL lock.

It will be appreciated by a person skilled in the art that alternative embodiments to that described above are possible. For example, the frequencies mentioned above are examples only, and other applications or requirements are obviously envisaged.

An alternative embodiment can implemented in a TErrestrial Trunked RAdio (TETRA) standard frequency synthesiser. With π/4—Differential Quadrature Phase Shift Keying (DQPSK) modulation being performed with respect to the PLL, the loop bandwidth needs to be large enough to meet the phase error requirements. In the prior art this is typically at the expense of increased phase noise. The present invention mitigates this problem.

Furthermore, the precise implementation details and components may differ from those described above, such as the D-type flip-flops, which could be replaced with other delay means.

The invention claimed is:

1. A noise shaping arrangement for a phase locked loop, the arrangement comprising:
    a first order sigma-delta modulator arranged to provide a first-order quantized output and a feedback path output;
    a second order sigma-delta modulator coupled to receive the feedback path output from the first order sigma-delta modulator and arranged to provide a second order quantized output; and
    combination means arranged to combine the first and second order quantized outputs to provide a combined third order quantized output, wherein the combined third order output provides noise shaping with a frequency notch spectrum.

2. The arrangement of claim 1 wherein the frequency notch spectrum is used to locate one or more complex conjugate pairs of zeros.

3. The arrangement of claim 2 wherein the one or more complex conjugate pairs of zeroes is located on the unity circle.

4. The arrangement of claim 2 wherein the one or more complex conjugate pairs of zeroes is located away from the real axis.

5. The arrangement of claim 4 wherein the frequency location of the one or more complex pair of zeros is a selected one of substantially 365 kHz and substantially 518 kHz.

6. The arrangement of any preceding claim where the feedback path output of the first order sigma-delta modulator received by the second order sigma-delta modulator is scaled by a factor of substantially one quarter and wherein accumulators of the first order and second order sigma-delta modulator respectively have the same bit-size.

7. The arrangement of claim 1, further comprising a delay block coupled between the feedback output of the first order sigma-delta modulator and the combination means.

8. The arrangement of claim 1 wherein the combination means includes scaling means coupled to scale the second order quantized output of the second order sigma-delta modulator by a predetermined scaling factor.

9. The arrangement of claim 8 wherein the predetermined scaling factor is substantially $2^{-22}$.

10. The arrangement of claim 1, wherein the second order sigma-delta modulator is operable to cancel the quantisation noise of the first order sigma-delta modulator.

11. The arrangement of claim 1 wherein the feedback path output comprises a quantisation noise of the first order sigma-delta modulator.

12. The arrangement of claim 1 wherein the frequency notch spectrum comprises at least one non-DC frequency notch.

13. The arrangement of claim 1 wherein the second order sigma-delta modulator comprises a loop arrangement having a forward processing block implementing the transfer function given by the z-transform:

$$\frac{z^{-1}}{1 - 2z^{-1}\cos\theta + z^{-2}}$$

and a feedback processing block implementing the function given by the z-transform:

$$2\cos\theta - z^{-1}$$

where $$\theta = 2\pi \frac{f}{f_s}$$

and f is the desired notch frequency and $f_s$ is the sample frequency.

14. A phase locked loop incorporating the noise shaping arrangement of claim 1.

15. A method for noise shaping in a phase-locked loop, the method comprising the steps of:
providing a first order quantized output from a first order sigma-delta modulator;
providing a second order quantized output from a second order sigma-delta modulator coupled to receive a feedback path output from the first sigma-delta modulator;
combining the first and the second order quantized outputs to provide a combined third order quantized output, wherein the combined third order output provides noise shaping with a frequency notch spectrum.

16. The method of claim 15 wherein the phase locked loop is a fractional-n phase locked loop frequency synthesizer.

* * * * *